(12) United States Patent
Takahashi et al.

(10) Patent No.: US 9,525,018 B2
(45) Date of Patent: Dec. 20, 2016

(54) OLED DISPLAY PANEL AND MANUFACTURING METHOD THEREOF

(71) Applicant: Japan Display Inc., Tokyo (JP)

(72) Inventors: Kouhei Takahashi, Tokyo (JP);
Hirotsugu Sakamoto, Tokyo (JP);
Takeshi Ookawara, Tokyo (JP);
Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/091,757

(22) Filed: Apr. 6, 2016

(65) Prior Publication Data

US 2016/0225842 A1 Aug. 4, 2016

Related U.S. Application Data

(63) Continuation of application No. 14/228,338, filed on Mar. 28, 2014.

(30) Foreign Application Priority Data

Mar. 28, 2013 (JP) ................................. 2013-069663

(51) Int. Cl.
*H01L 27/32* (2006.01)
*H01L 51/52* (2006.01)

(52) U.S. Cl.
CPC ....... *H01L 27/3279* (2013.01); *H01L 51/5228* (2013.01); *H01L 51/5234* (2013.01); *H01L 51/5246* (2013.01); *H01L 51/5253* (2013.01); *H01L 2251/5338* (2013.01)

(58) Field of Classification Search
CPC .................... H01L 27/3279; H01L 51/5228
See application file for complete search history.

(56) References Cited

U.S. PATENT DOCUMENTS

| | | |
|---|---|---|
| 7,605,536 B2 | 10/2009 | Kim |
| 7,692,377 B2 | 4/2010 | Nakamura |
| 7,884,540 B2 | 2/2011 | Sung et al. |
| 7,915,818 B2 | 3/2011 | Kim |
| 8,026,511 B2 | 9/2011 | Choi et al. |
| 8,614,546 B2 | 12/2013 | Utsunomiya et al. |

(Continued)

FOREIGN PATENT DOCUMENTS

| | | |
|---|---|---|
| JP | 2003-045674 A | 2/2003 |
| JP | 2004-118015 A | 4/2004 |

(Continued)

OTHER PUBLICATIONS

Japanese Office Action mailed on Sep. 13, 2016 for corresponding Japanese Patent Application No. 2013-069663.

*Primary Examiner* — Mark Prenty
(74) *Attorney, Agent, or Firm* — Typha IP LLC

(57) ABSTRACT

An OLED display panel is provided which can control the problem of shedding even in high definition panels. Metal wiring 5 which conducts with an earth line of a flexible printed substrate 15 is provided on a substrate 1. A display area 2 comprised from a plurality of OLED elements is provided at the center of the substrate 1 and four low resistance metal films 3 are provided along each of four edges of the display area 2 on a surface of insulation films 8, 10 at the periphery of the display area 2. Among these, one low resistance metal film 3 conducts with the metal wiring 5 via a contact 3a.

11 Claims, 12 Drawing Sheets

(56) References Cited

U.S. PATENT DOCUMENTS

2007/0241664 A1 10/2007 Sakamoto et al.
2014/0291649 A1* 10/2014 Takahashi ........... H01L 51/5228
                                                        257/40

FOREIGN PATENT DOCUMENTS

| JP | 2006-318910 A | 11/2006 |
| JP | 2007-164161 A | 6/2007 |
| JP | 2007-200890 A | 8/2007 |
| JP | 2007-287354 A | 11/2007 |
| JP | 2010-153070 A | 7/2010 |

* cited by examiner

OLED DISPLAY PANEL AND MANUFACTURING METHOD THEREOF

CROSS REFERENCE TO RELATED APPLICATIONS

This application is a continuation of U.S. patent application Ser. No. 14/228,338, filed on Mar. 28, 2014, which is based upon and claims the benefit of priority from the prior Japanese Patent Application 2013-069663, filed on Mar. 28, 2013, the entire contents of which are incorporated herein by reference.

FIELD

The present invention is related to an OLED (organic light-emitting diode) display panel and a manufacturing method of the OLED display panel.

BACKGROUND

In recent years, the development of OLED display panels is progressing with the goal of achieving thinness, high luminosity and high speed of the display panel. These OLED display panels are provided from at least three organic light emitting diodes (OLED element) in which each pixel emits light in three primary colors (red, green, blue) respectively, response speed is fast due to the lack of mechanical operations, and in addition to high luminosity display being possible due to each pixel itself emitting light, next generation display panels are being expected since thinness is possible due to backlights becoming unnecessary.

Although these OLED display panels generally include a structure in which a plurality of OLED elements corresponding to each pixel of an image to be displayed are provided in a matrix on one substrate (glass substrate), in a so called top emission type panel, a transparent opposing substrate for preventing external light from entering is further bonded on an OLED element. Each OLED element in a top emission type panel is comprised from a TFT (Thin Film Transistor) drive circuit layer, a reflectance electrode layer (anode), a hole injection layer, a hole transport layer, an organic EL (Electro Luminescence) light emitting layer, an electron transport layer, an electron injection layer and a transparent electrode layer (cathode) in sequence from the substrate side. Furthermore, because the transparent electrode layer (cathode) is one sheet of transparent conductive material common to all the OLED elements, the transparent electrode layer is provided across the entire region of the display area (area in which an OLED element is provided) 101 shown in FIG. 12.

Although the transparent electrode layer is provided on a different layer to the TFT drive circuit provided on a substrate in the stacked structure described above, because a drive circuit for driving each OLED element or an element for supplying external drive power or an external drive signal to the drive circuit or connecting to ground is provided on the substrate, it is necessary to form a cathode contact 100 at a plurality of locations passing from the wiring on the substrate through to the layer in which the transparent electrode is provided as is shown in FIG. 12, make an earth wire provided on the substrate to conduct with the cathode contact 100 and connect the transparent electrode to each cathode contact 100.

Since the conducting material which forms the transparent electrode layer has a high resistance value, there is a larger drop in voltage from the wiring itself and a smaller potential difference with the cathode electrode the larger the gap between the transparent electrode and the cathode electrode 100 thereby a problem occurs wherein the amount of light emitted from an OLED element decreases (shedding).

Although arranging auxiliary wiring (bypass wiring) between the OLED element and each cathode contact in order to solve this shedding problem has been considered, this option is not suitable for a high definition display because auxiliary wiring must be arranged between each pixel.

Thus, the present invention attempts to provide an OLED display panel and manufacturing method thereof which can control shedding problems regardless of whether a panel is high definition or not.

SUMMARY

An OLED display panel according to the present invention arranged with an organic light-emitting element, the panel includes a substrate, a display area including a plurality of OLED elements arranged over the substrate, and a low resistance metal film provided along an exterior edge of the display area over the substrate, the low resistance metal film conducting with a transparent electrode of each OLED element forming the display area.

A method of manufacturing an OLED display panel according to the present invention arranged with an organic light-emitting element, the method includes forming a rectangular display area including a plurality of OLED elements and a layer of an insulation material surrounding the display area on a substrate, forming a low resistance metal film overlapping a plate shaped mask arranged with a slit along four edges of the display area over the substrate, on a surface of the layer of the insulation material, and forming a transparent electrode layer conducting with an OLED element forming the display area and each low resistance metal film.

DESCRIPTION OF EMBODIMENTS (First Embodiment)

Figure 1:
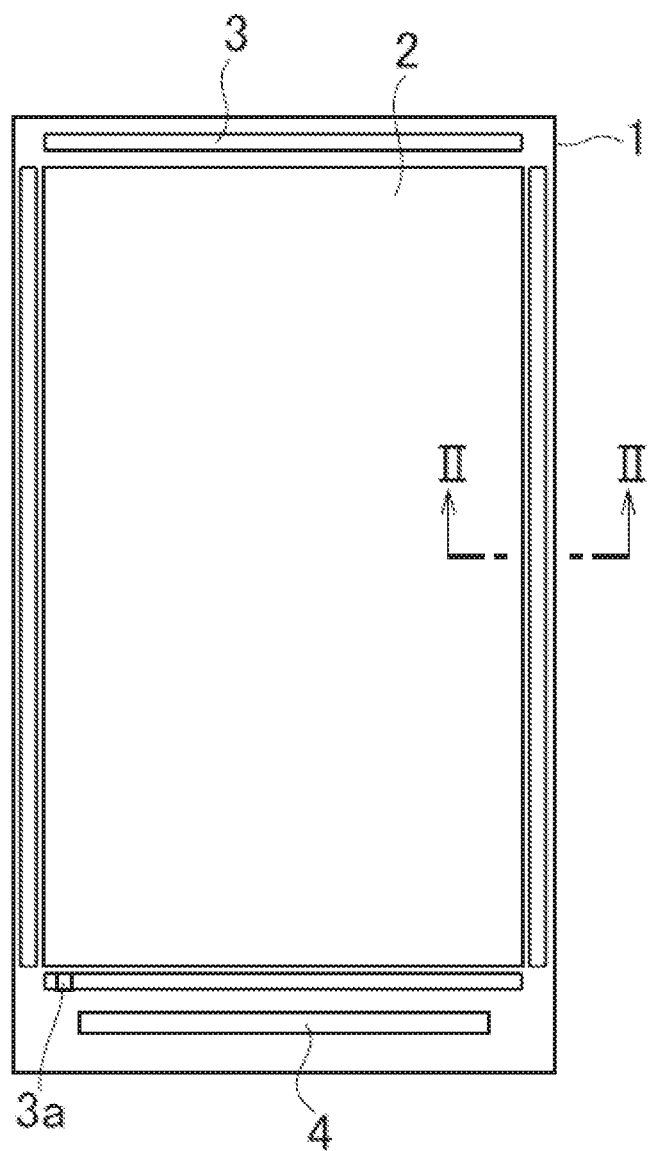
FIG. 1 is a planar diagram of an OLED display panel according to a first embodiment.
Figure 2:
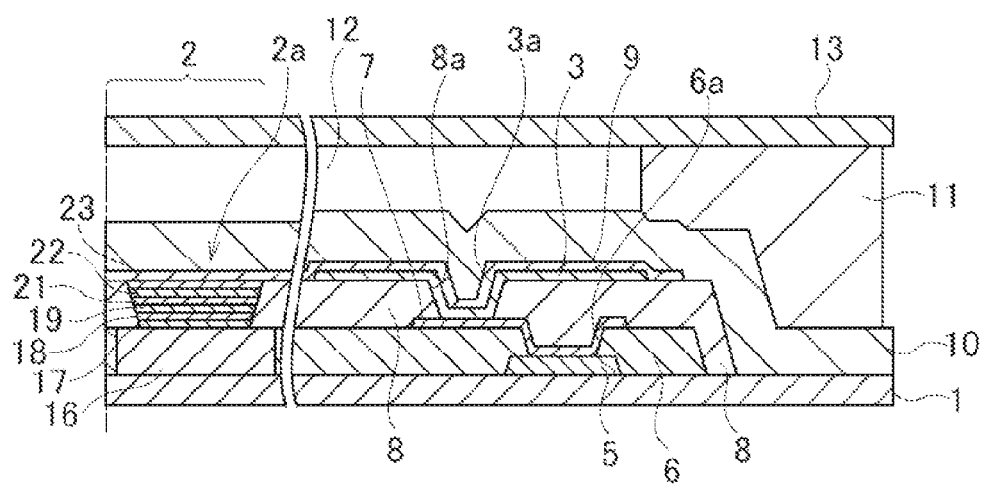
FIG. 2 is an exploded vertical cross sectional diagram of the vicinity of a cathode contact and a low resistance metal film.

FIG. 1 is a planar diagram of an OLED display panel 1. FIG. 2 is an exploded vertical cross sectional diagram along the line II-II shown in FIG. 1. Furthermore, the dotted line in FIG. 2 indicates that although the structure to the left side of the dotted line is also connected, this illustration omitted.

As is shown in FIG. 1, in a planar view, a display area 2 is provided at the center of the OLED display panel 1 by arranging a plurality of OLED elements aligned in a matrix shape and displays an image by selectively driving each OLED element. In addition, a long low resistance metal film 3 comprised from a metal such as aluminum or silver or the like is provided at four sections of a periphery area (referred to in the present specification below as [frame area]) which are each connected to four sides of the display area 2 over the upper surface of the OLED display panel 1. The length in the long direction of each low resistance metal film 3 is the same as the length of an adjacent side in the display area. In addition, a connector 4 which includes an earth terminal which conducts with each low resistance metal film 3 via an earth wire and a terminal for supplying drive power and a drive signal to a drive circuit (not shown in the diagram) for selectively driving each OLED light emitting element within the display area 2 is arranged on one side of the frame area.

As is shown in FIG. 2, each OLED element 2a within the display area 2 is provided by a reflectance electrode layer (anode) 17, a hole injection layer 18, a hole transport layer 19, an organic EL (Electro Luminescence) light emitting layer 21, an electron transport layer 22, an electron injection layer 23 and a transparent electrode layer (cathode) 9 on a substrate 1. A transparent metal compound with a low work function is required for the material of the transparent electrode layer (cathode) 9. Thus, for example, it is possible to use IZO ($In_2O_3$—$ZnO$) as the material of the transparent electrode layer (cathode) 9. In addition, after forming a silver thin film on the electron injection layer 23, a compound structured transparent electrode layer (cathode) 9 may be provided by forming an ITO ($In_2O_3$—$SnO_2$) thin film.

A metal wire 5 comprised from a low resistance metal (aluminum, silver or the like) thin film which conducts with an earth terminal of the connector 4 is provided over the frame area over the substrate 1. The metal wire 5 is covered by a planarized layer 6 comprised from an insulation material the same as the TFT (Thin Film Transistor) drive circuit layer 16 which forms the OLED element 2a within the display area 2. In addition, a contact hole 6a is provided at one part of the planarized layer 6. An ITO (Indium Tin Oxide) layer 7 is provided on the interior surface of the contact hole 6a and the periphery of the contact hole 6a on the surface of the planarized layer 6 and this ITO layer 7 conducts with the metal wire 5 via the contact hole 6a. The planarized layer 6 and ITO layer 7 are further covered by a rib layer 8 which is a layer of an insulation material for sectioning each OLED element 2a (except the transparent electrode layer (cathode) 9) within the display area 2. A contact hole 8a is arranged at one section (a position overlapping the left end of the low resistance metal film 3 on the bottom side of FIG. 1) of the rib layer 8.

Each low resistance metal film 3 described above is provided on the surface of the rib layer 8. In addition, one part (contact 3a) of the low resistance metal film 3 overlapping the contact hole 8a described above enters the interior of the contact hole 8a and conducts with the ITO layer 7. Furthermore, if the thickness of each low resistance metal film 3 is for example about 100 nm or above, it is possible to maintain a low resistance value of the low resistance metal film 3 itself.

The transparent electrode 9 is a common electrode with respect to each OLED element and is provided over the entire surface of the display area 2. The transparent electrode 9 spreads to the periphery portion of the display area 2. The transparent electrode 9 overlaps the low resistance metal film 3 at the periphery portion of the display area 2 and conducts with the low resistance metal film 3. The surfaces of the transparent electrode layer 9, rib layer 8 and substrate 1 are covered by a sealing film 10 across the entire area except the formation sections of the connector 4.

A transparent opposing substrate 13 is covered in the area except the formation sections of the connector 4 over the substrate 1 while a gap is maintained with the substrate 1 by a seal 11. A filler 12 comprised from a transparent epoxy resin is filled into a space enclosed by the opposing substrate 13, seal 11 and sealing film 10.

Using the OLED display panel 1 of the present embodiment configured as described above, all of the low resistance metal films 3 provided along the four sides of the display area 2 mutually conduct with each other via an interposing transparent electrode layer 9 and also conducts with the contact 3a using this conduction. At this time, although a slight drop in voltage occurs when a current crosses a transparent electrode 9 between a pair of adjacent low resistance metal films 3, a slight amount of voltage drop is acceptable since the gap between pairs of low resistance metal films 3 is narrow and consequently a conducting potential is maintained across almost the entire area of all the low resistance metal films 3.

Figure 12:
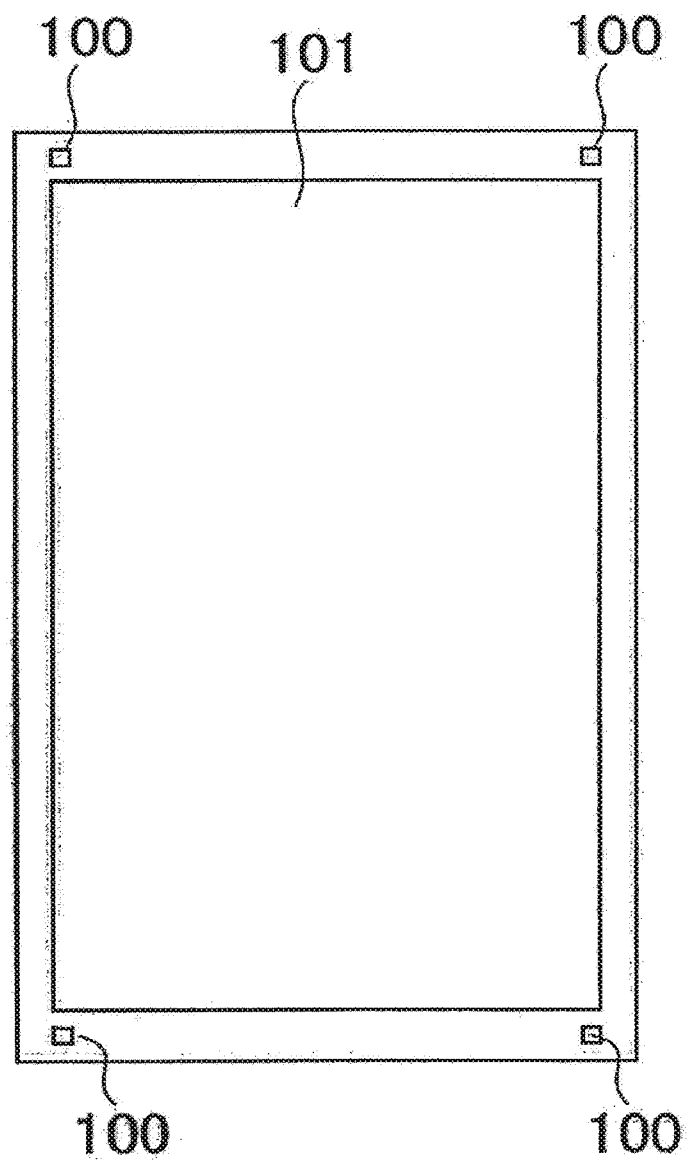
FIG. 12 is a planar diagram of a conventional OLED display panel.

In addition, because the low resistance metal film 3 is provided near the four sides of the display area 2, the distance up to the nearest low resistance metal film 3 at any position within the display area 2 is shorter than the distance up to the vicinity of the four corners of the display area 2 provided with a contact 100 in the conventional OLED display shown in FIG. 12. Therefore, even if a drop in voltage occurs due to the resistance distribution of the transparent electrode layer 9 itself, because the amount of the drop in voltage is proportional to the distance up to a low resistance metal film (low resistance metal film 3, contact 100), the amount of the drop in voltage according to the present embodiment is smaller than in a conventional display. Therefore, according to the present embodiment, shedding which accompanies a cathode resistance distribution is deleted and high image quality is achieved even in high definition panels.

In addition, according to the present embodiment, since a sufficient number of sections of the contact 3a is kept to a necessary minimum, it is possible to narrow the width of the frame area for securing formation of the contact 3a and consequently it is possible to realized a narrow frame area width.

Figure 3:
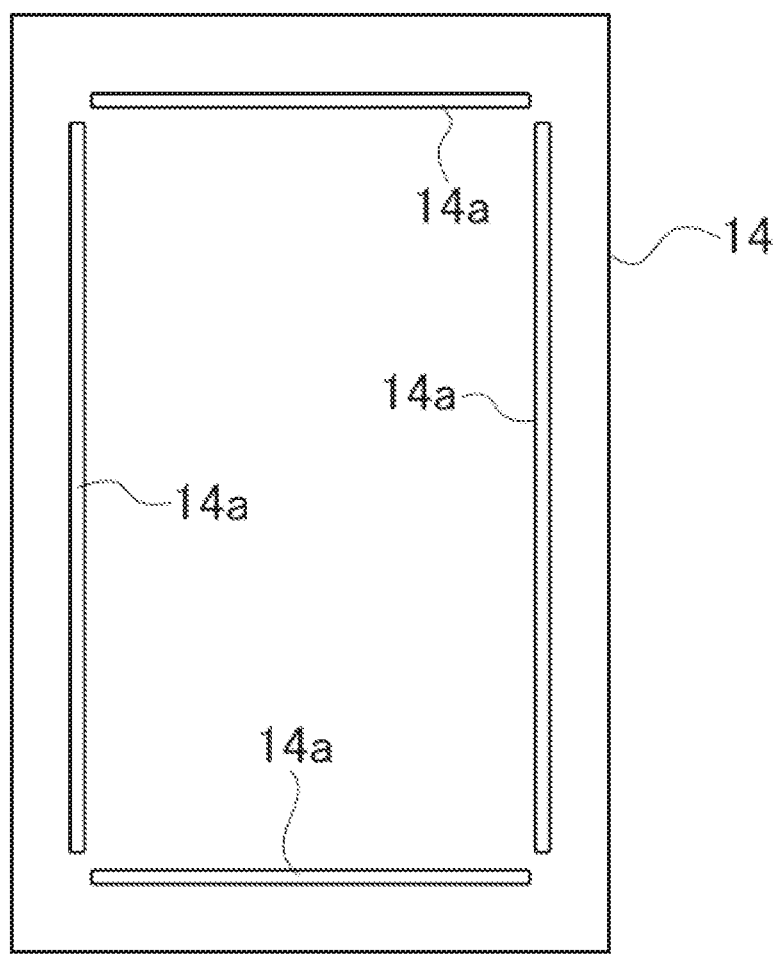
FIG. 3 is a planar diagram of a mask for forming the low resistance metal film according to the first embodiment.
Figure 4:
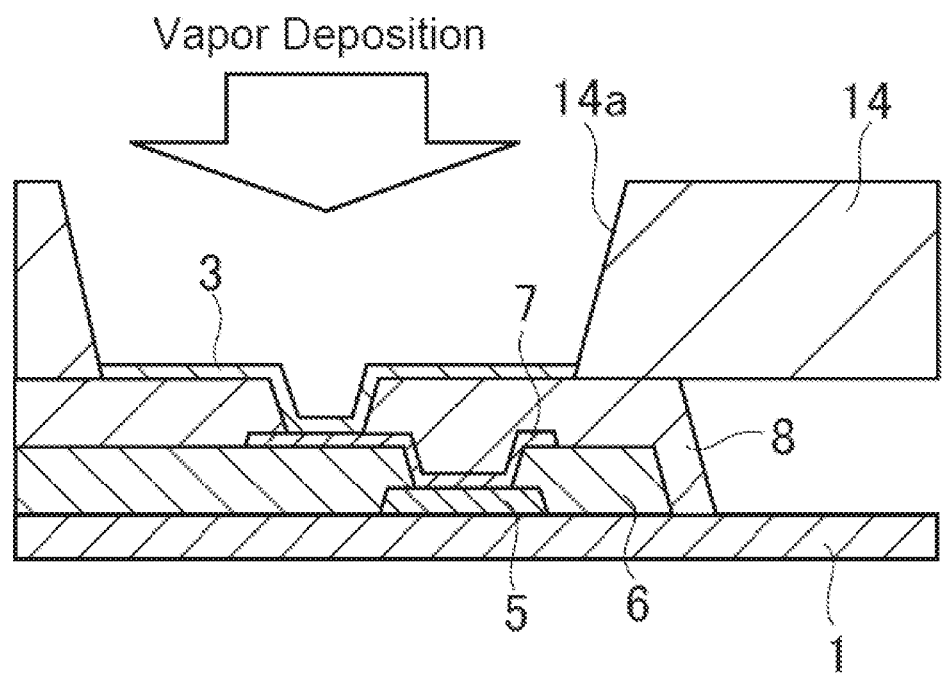
FIG. 4 is an exploded vertical cross sectional diagram showing a formation process of the low resistance metal film.

A manufacturing process of the low resistance metal film 3 is explained below. Metal wiring 5, planarized layer 6, ITO layer 7 and rib layer 8 are provided over the substrate 1 at the same time as forming the display area 2 comprised from a plurality of OLED elements 2a (except the transparent electrode layer (cathode) 9). In this state, a mask 14 which shows this planar shape in FIG. 3is overlaps the rib layer 8. The mask 14 is a plate with the same area as the substrate 1 and four slits 14a with the same shape as each low resistance metal film 3 are arranged aligned in a rectangle. In this way, because a slit arranged in the mask 14 is divided into four slits 14a corresponding to the low resistance metal film 3 which is also divided into four, a part (part which sections the inner edge of the low resistance metal film 3) further to the interior than the slit 14a in the mask 14 is supported in the interior of a part (part which sections the outer edge of the low resistance metal film 3) further to the exterior than the slit 14a near the four corners. Therefore, since one entire mask 14 is sufficient, it is possible to form the four low resistance metal films 3 by just one film formation process (deposition or sputtering) using this single mask 14.

Thus, the low resistance metal film 3 is provided at a position overlapping the slit 14a of the mask 14 by inserting the substrate 1 overlapping the mask 14 into a chamber and depositing or sputtering a low resistance metal. Following this, the mask 13 is removed from the substrate 1, the transparent electrode layer 9 and sealing film 10 are provided and the opposing substrate 13 is applied via the seal 11 and filler 12. Furthermore, it is desirable that aluminum (Al) or silver (Ag) is used as the low resistance metal film 3.

Figure 5:
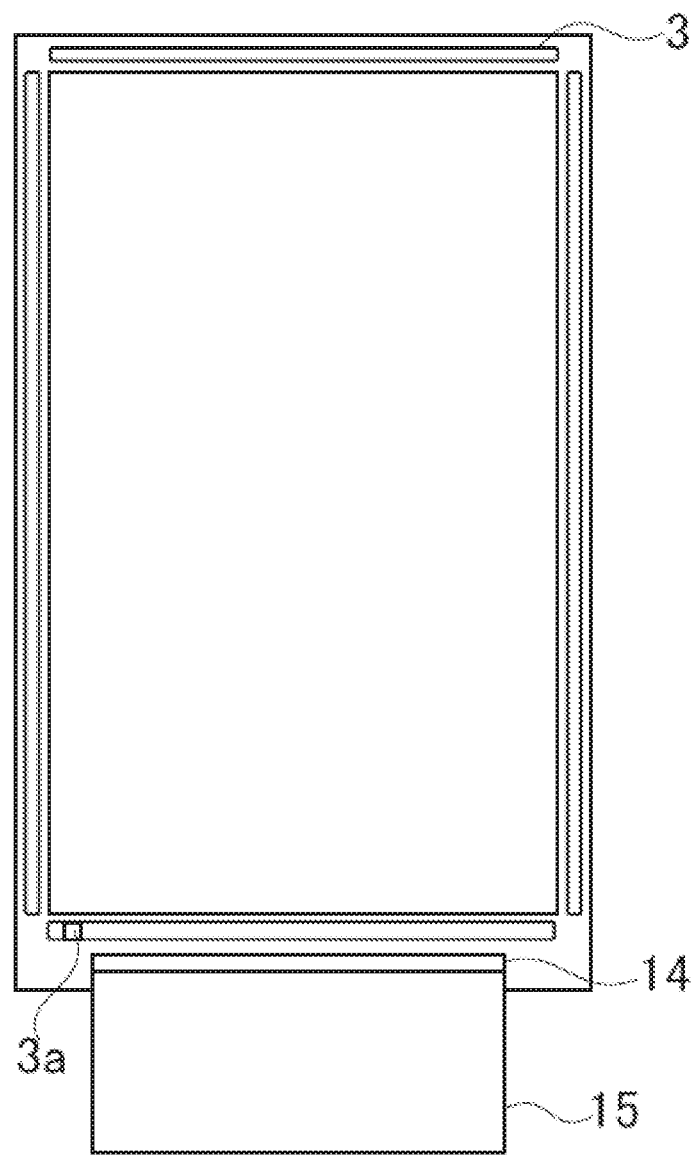
FIG. 5 is a planar diagram showing a connection position of a flexible printed substrate to an OLED display panel.

The OLED display panel completed as described above is incorporated into a casing of an electronic device not shown in the diagram by connecting the end of a flexible printed substrate 15 which includes a wire for supplying drive power or a drive signal and an earth wire to the terminal 4 as is shown in FIG. 5.

[Second Embodiment]

Figure 6:
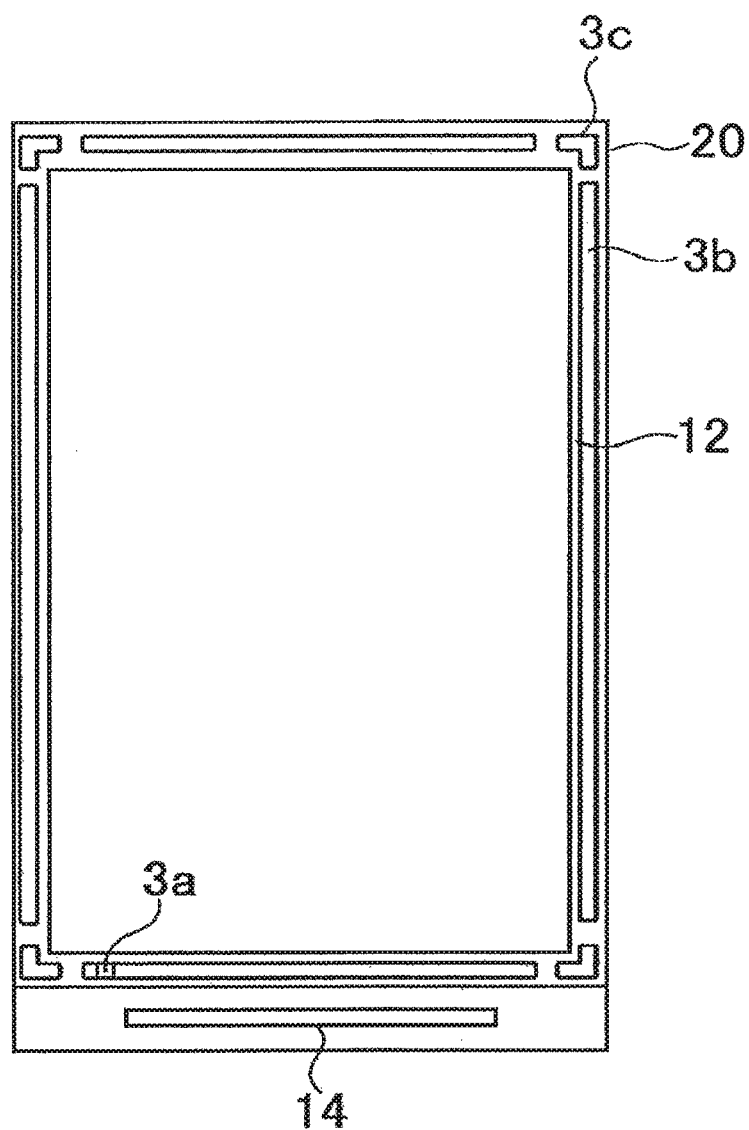
FIG. 6 is a planar diagram of an OLED display panel according to a second embodiment.

FIG. 6 is a planar diagram of an OLED display panel 20 according to a second embodiment of the present invention. As is shown in FIG. 6, the low resistance metal film 3 of the OLED display panel 20 according to the second embodiment is provided from four long low resistance metal films 3b each provided parallel to the four sides of the display area 2 and four hook shaped low resistance metal films 3c each provided near the four corners of the display area 2. Because the remaining structure of the OLED display panel 20 according to the second embodiment of the present invention is exactly the same as the structure described in the first embodiment, an explanation is omitted here.

Figure 7:
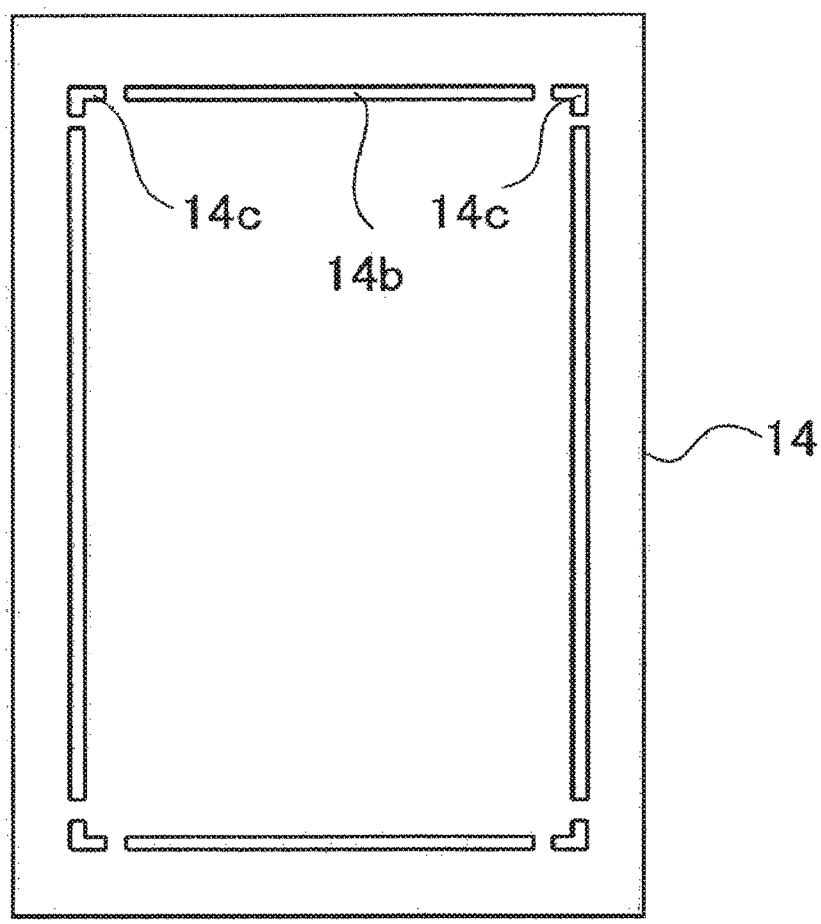
FIG. 7 is a planar diagram of a mask for forming the low resistance metal film according to the second embodiment.

FIG. 7 is a planar diagram of the mask 14 used for forming the low resistance metal films 3b, 3c according to the second embodiment. As is shown in FIG. 7, six slits 14b, 1c with the same shape as the low resistance metal film 2 shown in FIG. 6 are arranged in the mask 14 of the second embodiment.

Figure 8:
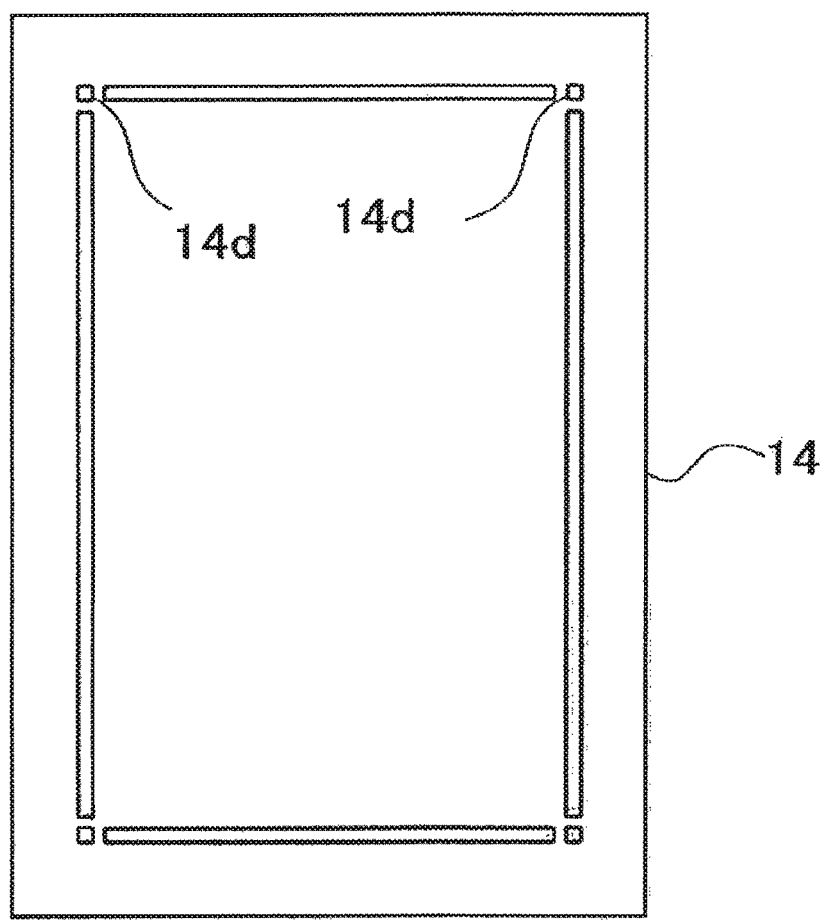
FIG. 8 is a modified example of a mask.

As is shown in the second embodiment explained above, it is not an essential requirement that the low resistance metal film 3 be divided at the four corners of the display area 2. Therefore, for example, as is shown in FIG. 8, the mask 14 provided with a hole 14d for forming a dot shaped low resistance metal film at the four corners of the display area 2 may also be used.

[Third Embodiment]

Figure 9:
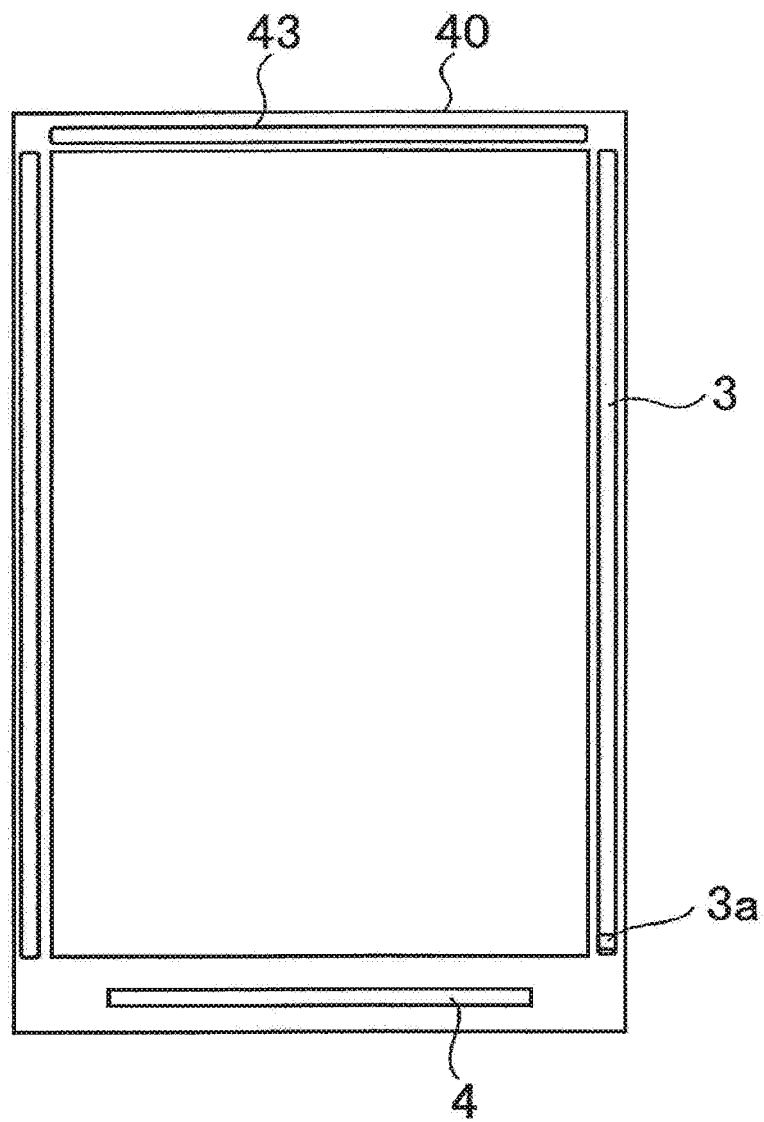
FIG. 9 is a planar diagram of an OLED display panel according to a third embodiment.

FIG. 9 is a planar diagram of an OLED display panel 40 according to a third embodiment of the present invention. As is shown in FIG. 9, compared to the first embodiment shown in FIG. 1, the low resistance metal film 3 between the connector 4 and the display area 2 is omitted from the OLED display panel 40 according to the third embodiment. Because the remaining structure of the OLED display panel 40 according to the third embodiment of the present invention is exactly the same as the structure described in the first embodiment, an explanation is omitted here.

In this way, if the low resistance metal film 3 is provided at least along the pair of long sides and one short side of the rectangular display area 2, because the distance from an OLED element positioned at the center of the other short side up to another low resistance metal film 3 is equal to the distance from an OLED element positioned at the center of the display area 2 up to the low resistance metal film 3 provided adjacent to a long side, it is possible to sufficiently obtain the effect of shedding prevention.

[Fourth Embodiment]

Figure 10:
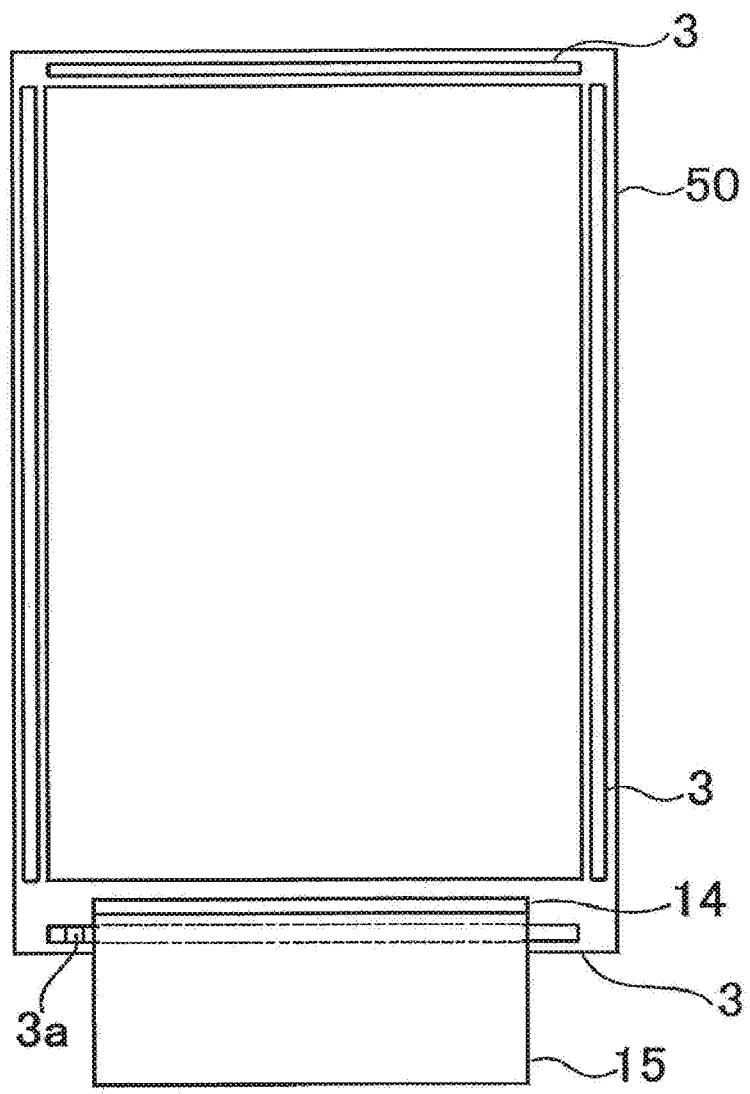
FIG. 10 is a planar diagram of an OLED display panel according to a fourth embodiment.

FIG. 10 is a planar diagram of an OLED display panel 50 according to a fourth embodiment of the present invention. As is shown in FIG. 10, compared to the first embodiment shown in FIG. 1, only the point where the connector 4 is provided between the display area 2 and the low resistance metal film 3 is different. Because the remaining structure of the OLED display panel 50 according to the fourth embodiment of the present invention is exactly the same as the structure described in the first embodiment, an explanation is omitted here.

[Modified Example]

Figure 11:
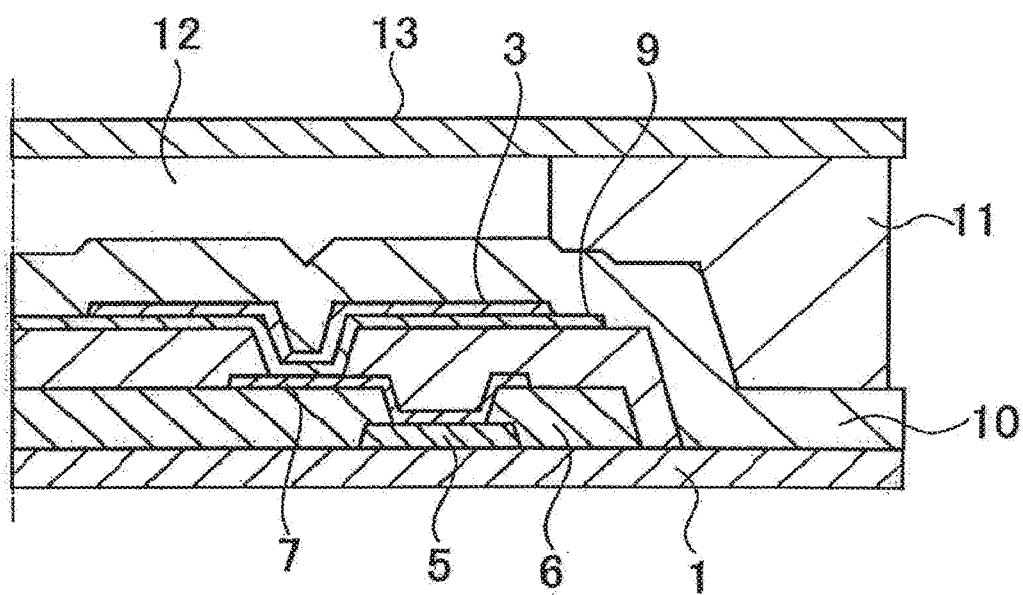
FIG. 11 is an exploded vertical cross sectional diagram showing a modified example of a layer structure of a cathode electrode and low resistance metal film.

FIG. 11 is an exploded vertical cross sectional diagram which shows a modified example of an OLED display panel according to the present invention and is equivalent to FIG. 2. As is shown in FIG. 11, the transparent electrode layer 9 may be provided below the low resistance metal film 3, inserted into the contact hole 8a and connected and conducting with the ITO layer 7. That is, the transparent electrode layer 9 may also be provided before the low resistance metal film 3. Even in this case, a current from each OLED element flows once to the nearest low resistance metal film 3 via the transparent electrode 9, reaches the interior of the contact hole 8a via each low resistance metal film 3, flows through the transparent electrode layer 9 and to the ITO layer 7. Therefore, even when a structure according to this modified example is adopted, it is possible to achieve the same shedding prevention effects as those explained in the first embodiment.

As described above, according to the OLED display panel disclosed in the first to fourth embodiments, it is possible to control the problem of shedding even in a high definition panel. In addition, according to the manufacturing method of an OLED display panel of the present invention, it is possible to form a low resistance metal film of this OLED display panel in one formation process using a single mask.

What is claimed is:
1. A display device comprising:
   a substrate on which a display area including a plurality of organic light-emitting elements and a peripheral area surrounding the display area are arranged;
   a first wiring in the peripheral area;
   a first insulation layer on the first wiring, the first insulation layer including a first opening;
   a second wiring on the first insulation layer, the second wiring conducting with the first wiring via the first opening;
   a second insulation layer on the second wiring and the first insulation layer, the second insulation layer including a second opening;
   a low resistance metal film on the second insulation layer, the low resistance metal film conducting with the second wiring via the second opening, extending along an exterior edge of the display area, and conducting with a transparent electrode of the plurality of organic light-emitting elements; and
   a sealing film covering the plurality of organic light-emitting elements, the low resistance metal film, and the transparent electrode,
   wherein the display area, a first edge portion of the low resistance metal film, a second edge portion of the low resistance metal film, and an edge portion of the substrate are arranged in this order, and wherein the transparent electrode covers each of the first and second side edge portions of the low resistance metal film.

2. The display device according to claim 1,
wherein a distance between the display area and the first opening is larger than a distance between the display area and the second opening, and
wherein the transparent electrode is a cathode.

3. The display device according to claim 1,
wherein the transparent electrode is arranged on the low resistance metal film.

4. The display device according to claim 1, wherein the low resistance metal film entirely covers the first opening.

5. The display device according to claim 1,
wherein the low resistance metal film, the transparent electrode, and the sealing film are arranged in this order in the second opening.

6. A display device comprising:
a substrate on which a display area including a plurality of organic light-emitting elements and a peripheral area surrounding the display area are arranged;
a first wiring in the peripheral area;
a first insulation layer on the first wiring the first insulation layer including a first opening;
a second wiring on the first insulation layer, the second wiring conducting with the first wiring via the first opening;
a second insulation layer on the second wiring and the first insulation layer, the second insulation layer including a second opening;
a metal film on the second insulation layer, the metal film including silver or aluminum, conducting with the second wiring via the second opening, extending along an exterior edge of the display area, and conducting with a cathode of the plurality of organic emitting elements;
a flexible printed substrate electrically connected to a terminal in the peripheral area; and
a sealing film covering the plurality of organic light-emitting elements, the metal film, and the cathode,
wherein a distance between the display area and the terminal is larger than a distance between the metal film and the display area
wherein the display area, a first edge portion of the metal film, a second edge portion of the metal film, and an edge portion of the substrate are arranged in this order, and
wherein the cathode covers each of the first and second side edge portions of the metal film.

7. The display device according to claim 6,
wherein a distance between the display area and the first opening is larger than a distance between the display area and the second opening.

8. The display device according to claim 6,
wherein the cathode is arranged on the metal film.

9. The display device according to claim 6,
wherein the metal film entirely covers the first opening.

10. The display device according to claim 6,
wherein the metal film, the cathode, and the sealing film are arranged in this order in the second opening.

11. The display device according to claim 6, further comprising:
a counter substrate on the sealing film; and
a filling material between the counter substrate and the sealing film.

* * * * *